(12) United States Patent
Takada et al.

(10) Patent No.: US 6,278,257 B1
(45) Date of Patent: Aug. 21, 2001

(54) METHOD FOR DETECTING ABNORMAL CELL

(75) Inventors: Masahiro Takada, Aichi; Hirotaka Ishihara, Osaka; Toshiaki Nakanishi, Aichi, all of (JP)

(73) Assignee: Matsushita Electric Industrial Co. Ltd., Osaka (JP)

( * ) Notice: Subject to any disclaimer, the term of this patent is extended or adjusted under 35 U.S.C. 154(b) by 0 days.

(21) Appl. No.: 09/663,067

(22) Filed: Sep. 15, 2000

(30) Foreign Application Priority Data

Sep. 17, 1999 (JP) .................................................. 11-264678

(51) Int. Cl.[7] .......................... H01M 10/44; H01M 10/46
(52) U.S. Cl. ............................ 320/116; 320/134; 324/426
(58) Field of Search ...................................... 324/426, 433; 320/116, 119, 122, 134, 136

(56) References Cited

U.S. PATENT DOCUMENTS 5,469,042 * 11/1995 Ruhling ................................ 320/122
5,850,136 * 12/1998 Kaneko ............................. 320/122 X
5,932,990 * 8/1999 Kaneko ................................. 320/122
5,998,967 * 12/1999 Umeki et al. ........................ 320/122

* cited by examiner

Primary Examiner—Edward H. Tso
(74) Attorney, Agent, or Firm—Michael K. Kelly; Snell & Wilmer, LLP

(57) ABSTRACT

A method for detecting an abnormal cell in a battery system, wherein: the battery system includes a plurality of blocks serially connected together; each of the plurality of blocks includes a plurality of cells serially connected together and the method includes: a first step of detecting a block voltage for each of the plurality of blocks and detecting a current of the battery system; a second step of calculating a charge/discharge electric power for each of the plurality of blocks based on the block voltage and the current; a third step of determining whether or not a value of the current is equal to or greater than a first predetermined value; a fourth step of determining whether or not a difference of the charge/discharge electric power between at least any two of the plurality of blocks is equal to or greater than a second predetermined value; and a fifth step of detecting a block including an abnormal cell based on determination results from the third step and the fourth step.

10 Claims, 8 Drawing Sheets

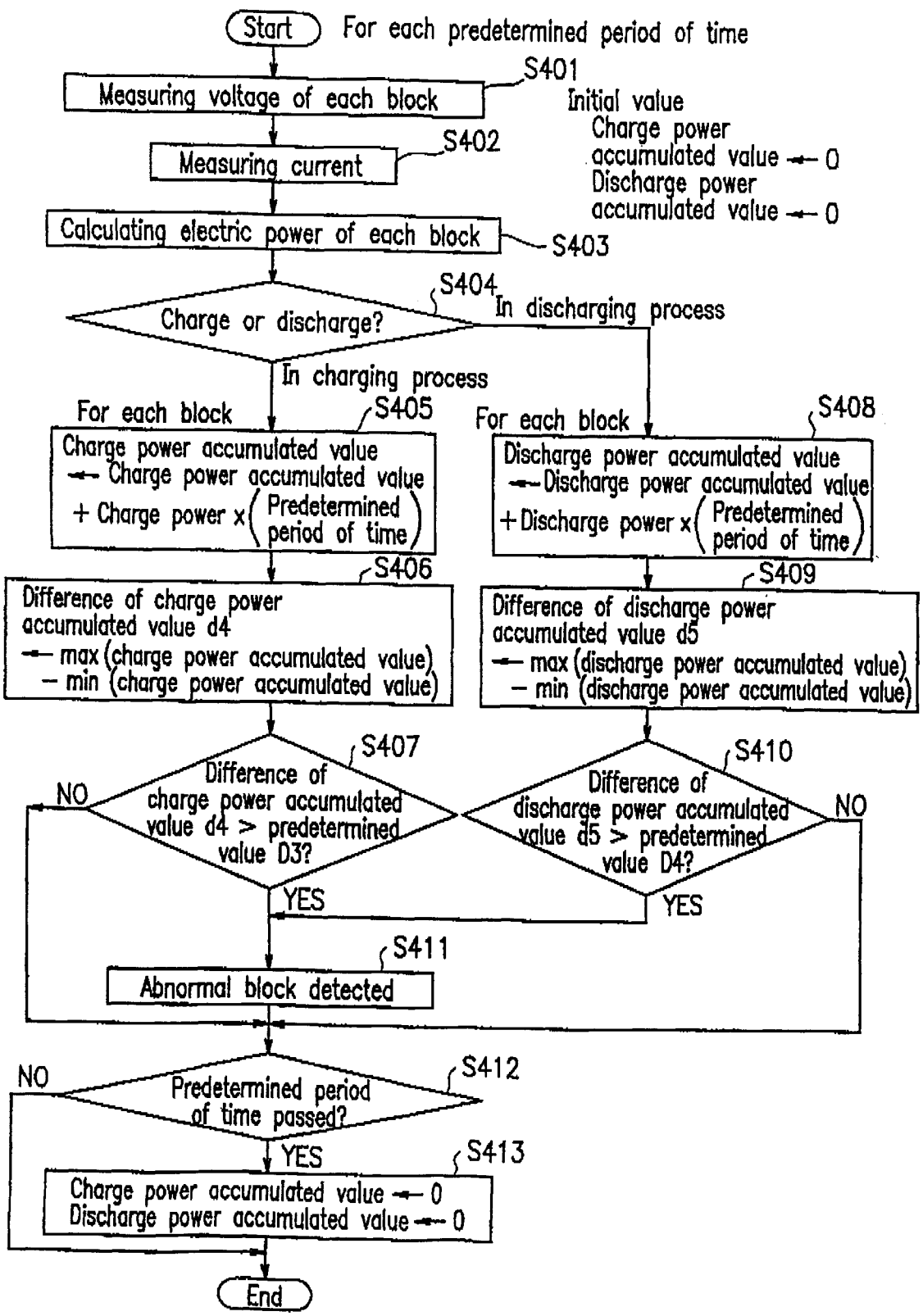

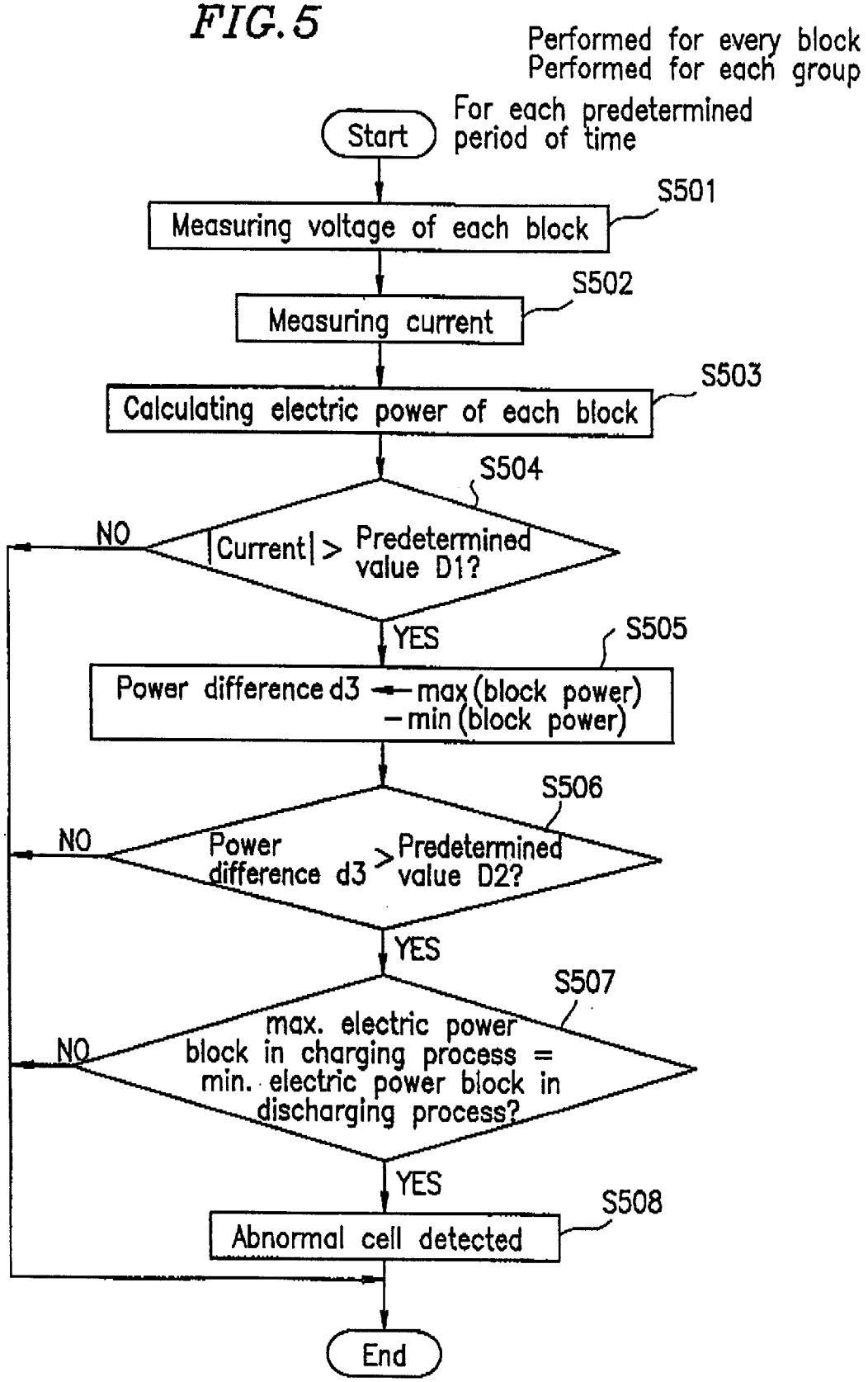

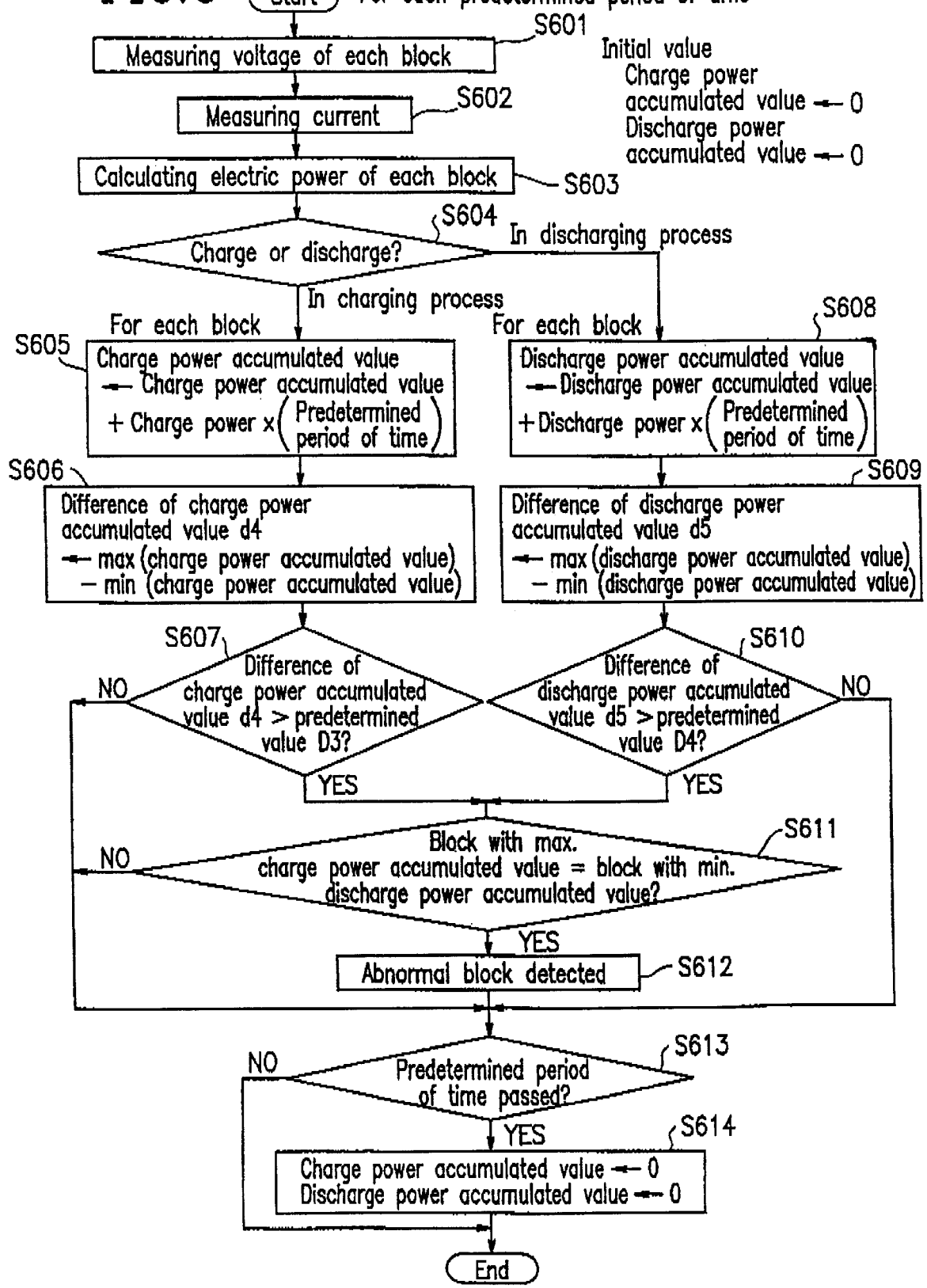

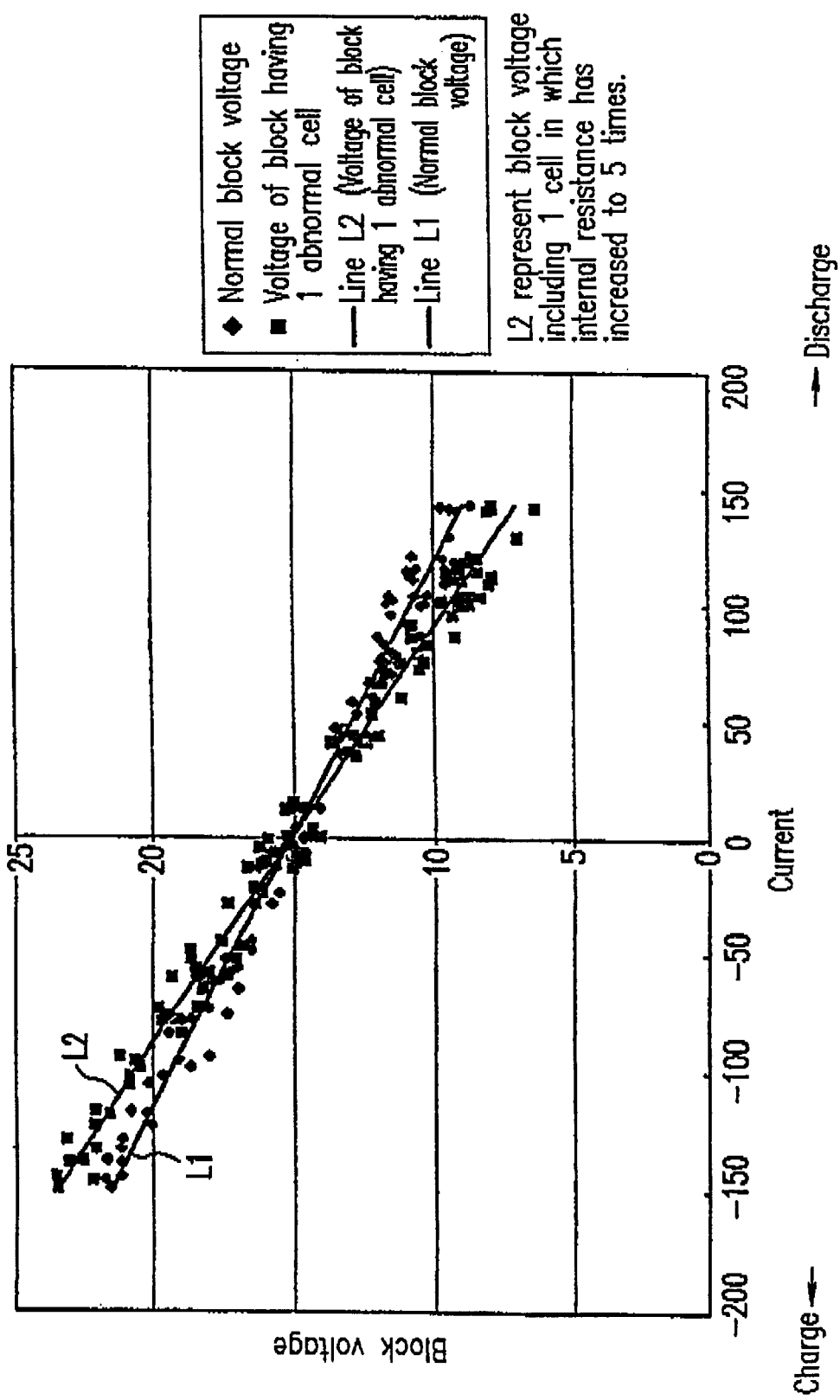

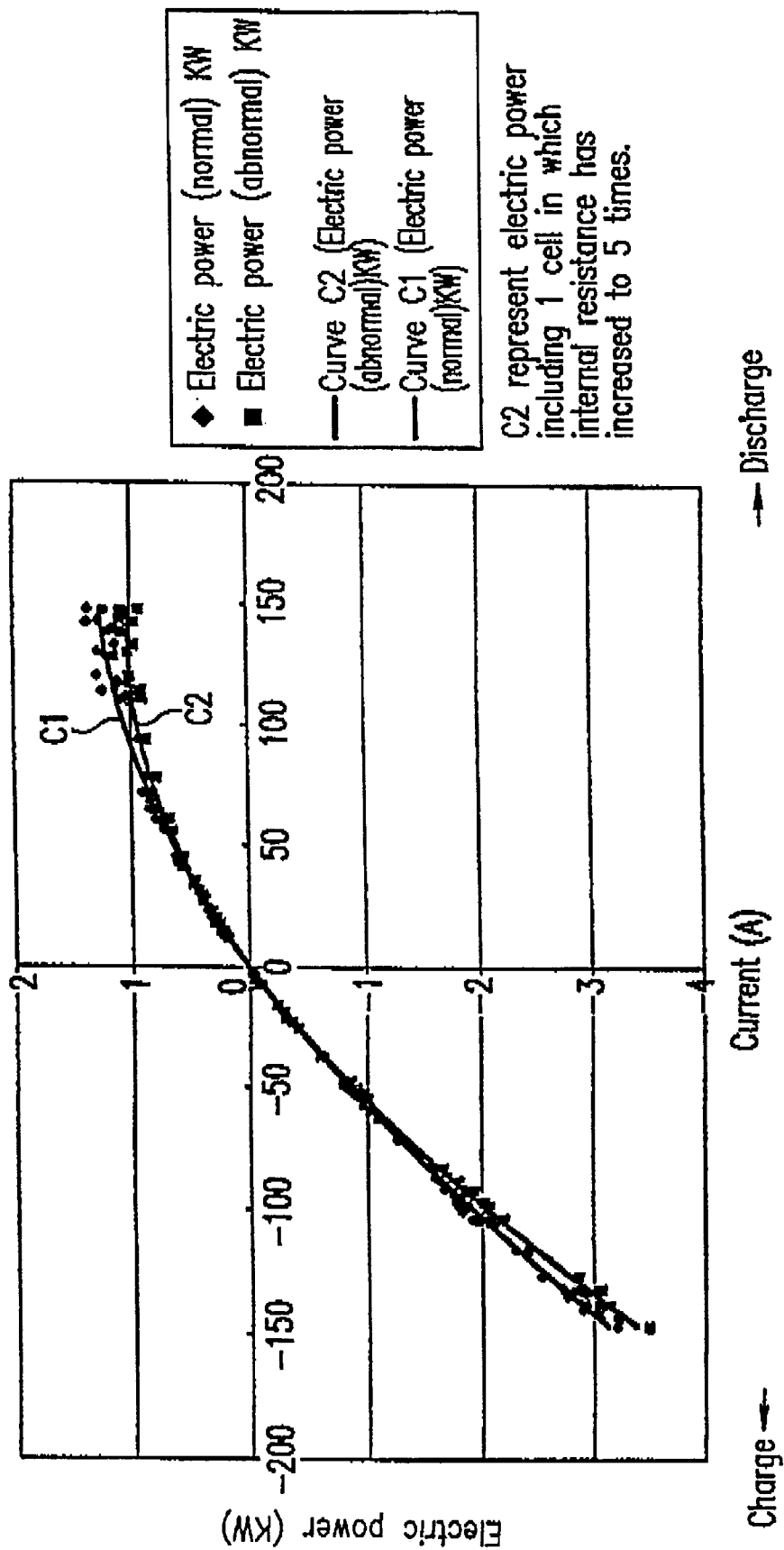

METHOD FOR DETECTING ABNORMAL CELL

BACKGROUND OF THE INVENTION

1. Field of the Invention

The present invention relates to a method for detecting an abnormal electric-cell, and more particularly to a method for detecting an abnormal electric-cell in a battery system including a plurality of blocks serially connected together, wherein each of the plurality of blocks includes a plurality of cells serially connected together.

2. Description of the Related Art

A hybrid electric vehicle uses a battery system including a plurality of blocks serially connected together, wherein each of the plurality of blocks includes a plurality of cells serially connected together.

The following abnormal cell detecting methods are known in the art for use with the battery system as described above: a method for detecting a block which includes an abnormal cell by calculating an internal resistance for each block based on the relationship between the block voltage and the current for each block; and a method for detecting a block which includes an abnormal cell based on the difference in voltage between blocks.

However, in the former conventional method in which the internal resistance is calculated for each block based on the relationship between the block voltage and the current for each block, the influence of current hysteresis is considerable. Thus, there is a problem that it is difficult to calculate the internal resistance accurately.

The latter conventional method has a problem as follows. There may be a difference in temperature among a plurality of cells. Therefore, if a battery system is used for a long period of time, unevenness in capacitance among the cells occurs. Accordingly, a difference in voltage among blocks occurs. Thus, in the method for detecting a block which includes an abnormal cell based on the difference in voltage between blocks, there is a problem that it is difficult to distinguish a difference in voltage between the blocks because of the presence of the abnormal cell from a difference in voltage between the blocks because of the unevenness in capacitance.

If the discharge electric power and the charge electric power are calculated for each block in a method for detecting an abnormal cell, a cell in which a drop in electromotive force, a minor short, a short, etc., has occurred may be detected as an abnormal cell as well as a cell in which the internal resistance has increased.

SUMMARY OF THE INVENTION

According to one aspect of the invention, there is provided a method for detecting an abnormal cell in a battery system, wherein: the battery system includes a plurality of blocks serially connected together; each of the plurality of blocks includes a plurality of cells serially connected together; and the method includes: a first step of detecting a block voltage for each of the plurality of blocks and detecting a current of the battery system; a second step of calculating a charge/discharge electric power for each of the plurality of blocks based on the block voltage and the current; a third step of determining whether or not a value of the current is equal to or greater than a first predetermined value; a fourth step of determining whether or not a difference of the charge/discharge electric power between at least any two of the plurality of blocks is equal to or greater than a second predetermined value; and a fifth step of detecting a block including an abnormal cell based on determination results from the third step and the fourth step.

According to one embodiment of the invention, there is provided a method for detecting an abnormal cell, wherein: the plurality of blocks is grouped into at least a first group and a second group; and the fourth step includes a stop of determining: whether or not a difference of the charge/discharge electric power between at least any two of several blocks of the first group is equal to or greater than a second predetermined value; and whether or not a difference of the charge/discharge electric power between at least any two of the several blocks of the second group is equal to or greater than the second predetermined value.

According to another embodiment of the invention, there is provided a method for detecting an abnormal cell, wherein: a temperature difference of any one of the blocks of the first group is smaller than the temperature difference between any one of the blocks of the first group and any one of the blocks of the second group; and a temperature difference of any one of the blocks of the second group is smaller than the temperature difference between any one of the blocks of the second group and any one of the blocks of the first group.

According to still another embodiment of the invention, there is provided a method for detecting an abnormal cell, wherein the fourth step includes a step of determining that an abnormal cell in which an internal resistance has increased exists in the block in the case that the block satisfies the following conditions (1) and (2): (1) a charge power difference is greater than the average value of a charge power difference between at least any two of the plurality of blocks by an amount equal to or greater than a third predetermined value; and (2) a discharge power difference is smaller than the average value of a discharge power difference between at least any two of the plurality of blocks by an amount equal to or greater than a fourth predetermined value.

According to still another embodiment of the invention, there is provided a method for detecting an abnormal cell, wherein the fourth step includes a step of determining that an abnormal cell in which an internal resistance has increased exists in the block in the case that the block satisfies the following conditions (1) and (2): (1) a charge power difference is greater than the average value of the charge power difference between at least any two of several blocks of the first group by an amount equal to or greater than the third predetermined value; and (2) a discharge power difference of the block is smaller than the average value of the discharge power difference between at least any two of several blocks of the first group by an amount equal to or greater than the fourth predetermined value.

According to one aspect of the invention, there is provided a method for detecting an abnormal cell in a battery system, wherein: the battery system includes a plurality of blocks serially connected together; each of the plurality of blocks includes a plurality of cells serially connected together; and the method includes: a first stop of detecting a block voltage for each of the plurality of blocks and a current of the battery system; a second step of calculating a charge/discharge power for each of the plurality of blocks based on the block voltage and the current; a third step of obtaining a charge/discharge power accumulated value for each of the plurality of blocks based on a time accumulated value for each of predetermined periods of time of the charge/discharge power; a fourth step of determining whether or not a difference of the charge/discharge power accumulated value between at least any two of the plurality of blocks is equal to or greater than a first predetermined value; and a fifth step of detecting a block including an abnormal cell based on a determination result of the fourth step.

According to one embodiment of the invention, there is provided a method for detecting an abnormal cell, wherein: the plurality of blocks is grouped into at least a first group and a second group; and the fourth step includes steps of determining: whether or not a difference of the charge/discharge power accumulated value between at least any two of several blocks of the first group is equal to or greater than a first predetermined value; and whether or not a difference of the charge/discharge power accumulated value between at least any two of several blocks of the second group is equal to or greater than a first predetermined value.

According to another embodiment of the invention, there is provided a method for detecting an abnormal cell, wherein: a temperature difference of any one of the blocks of the first group Is smaller than the temperature difference between any one of the blocks of the first group and any one of the blocks of the second group; and a temperature difference of any one of the blocks of the second group is smaller than the temperature difference between any one of the blocks of the second group and any one of the blocks of the first group.

According to still another embodiment of the invention, there is provided a method for detecting an abnormal cell, wherein the fourth step includes a step of determining that an abnormal cell in which an internal resistance has increased exists in the block In the case that the block satisfies the following conditions (1) and (2): (1) a difference of a charge power accumulated value is greater than the average value of a difference of a charge power accumulated value between at least any two of the plurality of blocks by an amount equal to or greater than a second predetermined value; and (2) a difference of discharge power accumulated value is smaller than the average value of a difference of a discharge power accumulated value between at least any two of the plurality of blocks by an amount equal to or greater than a third predetermined value.

According to still another embodiment of the invention, there is provided a method for detecting an abnormal cell, wherein: the fourth step includes a step Of determining an abnormal cell in which an internal resistance has increased exists in the block in the case that the block satisfies the following conditions (1) and (2): (1) a difference of a charge power accumulated value is greater than an average value of a difference of a charge power accumulated value between at least any two of several blocks of the first group by an amount equal to or greater than a second predetermined value; and (2) a difference of discharge power accumulated value is smaller than an average value of a difference of a discharge power accumulated value between at least any two of several blocks of the first group by an amount equal to or greater than a third predetermined value.

Thus, the Invention described herein makes possible the advantages of: (1) providing a method for detecting an abnormal cell which is capable of detecting a block including an abnormal cell accurately by calculating an increase in internal resistance for each block; (2) providing a method for detecting an abnormal cell which is capable of detecting a block including an abnormal cell accurately even if unevenness in capacitance among cells occurs; and (3) providing a method for detecting an abnormal cell which is capable of distinguishing a cell in which a drop in electromotive force, a minor short, a short, etc., has occurred from a cell in which an internal resistance has increased.

These and other advantages of the present invention will become apparent to those skilled in the art upon reading and understanding the following detailed description with reference to the accompanying figures.

BRIEF DESCRIPTION OF THE DRAWINGS

FIG. 4 is a flow chart of a second abnormal cell detecting method according to one embodiment of the present invention.

FIG. 5 is a flow chart of a third abnormal cell detecting method according to one embodiment of the present invention.

FIG. 6 is a flow chart of a fourth abnormal cell detecting method according to one embodiment of the present invention.

FIG. 7 is a graph illustrating measurement results of the current and the block voltage for a normal block and an abnormal block according to one embodiment of the present invention.

FIG. 8 is a graph illustrating measurement results of the current and the block electric power for a normal block and an abnormal block according to one embodiment of the present invention.

DESCRIPTION OF THE PREFERRED EMBODIMENTS

Figure 1:
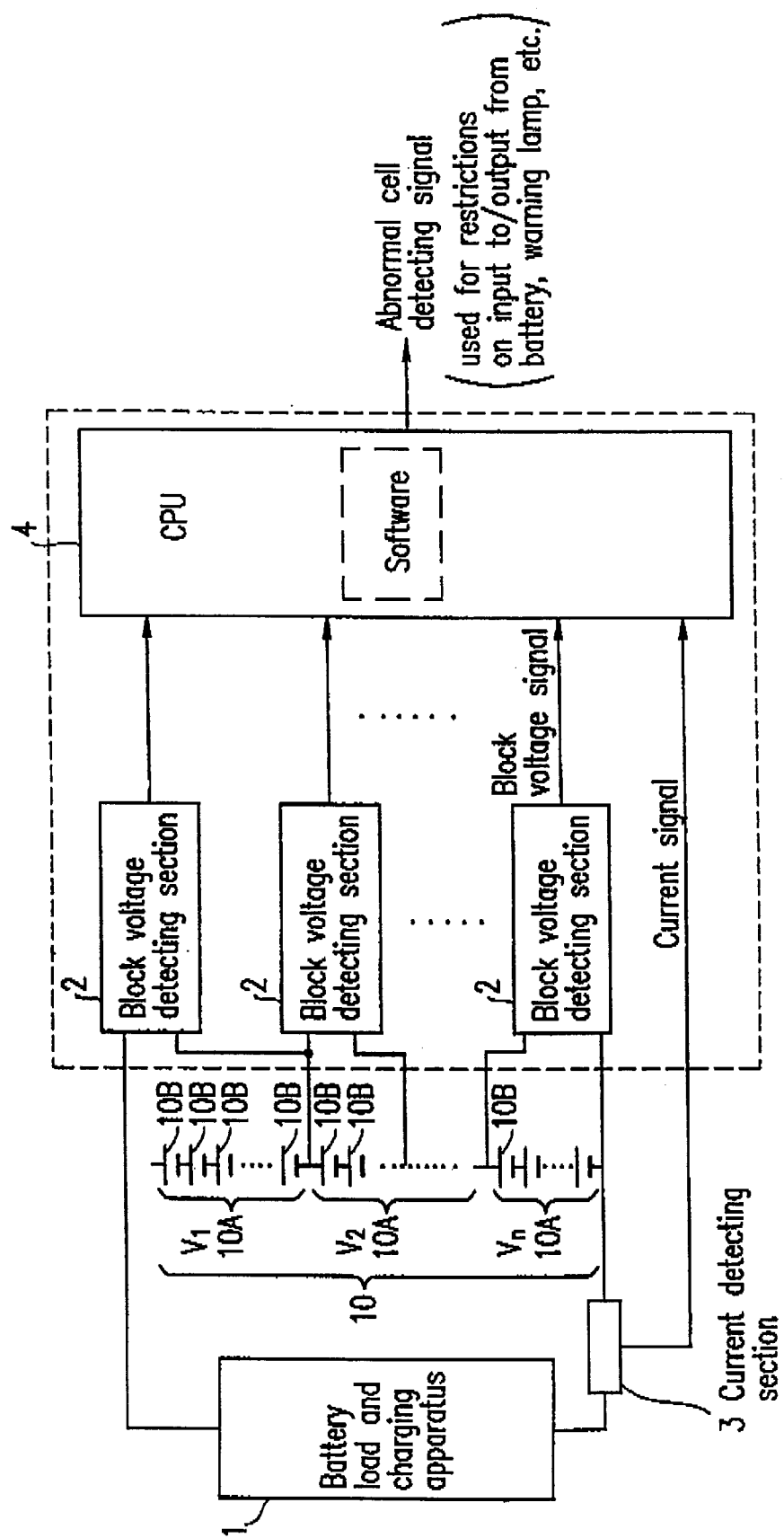
FIG. 1 is a structural diagram of an abnormal cell detecting apparatus according to one embodiment of the present invention.

FIG. 1 illustrates a structure of an abnormal cell detecting apparatus 100 according to one embodiment of the present invention. A battery system 10 includes a plurality of blocks 100 serially connected together. Each of the plurality of blocks 10A includes a plurality of cells 10B serially connected together.

The abnormal cell detecting apparatus 100 includes: block voltage detecting sections 2 provided respectively for the plurality of blocks 10A, a current detecting section 3 for detecting the current in the battery system 10; a charging apparatus 1 connected to the battery system 10; and a CPU 4 for detecting an abnormal cell based on output signals from the block voltage detecting sections 2 and the current detecting section 3.

(Embodiment 1)

Figure 2:
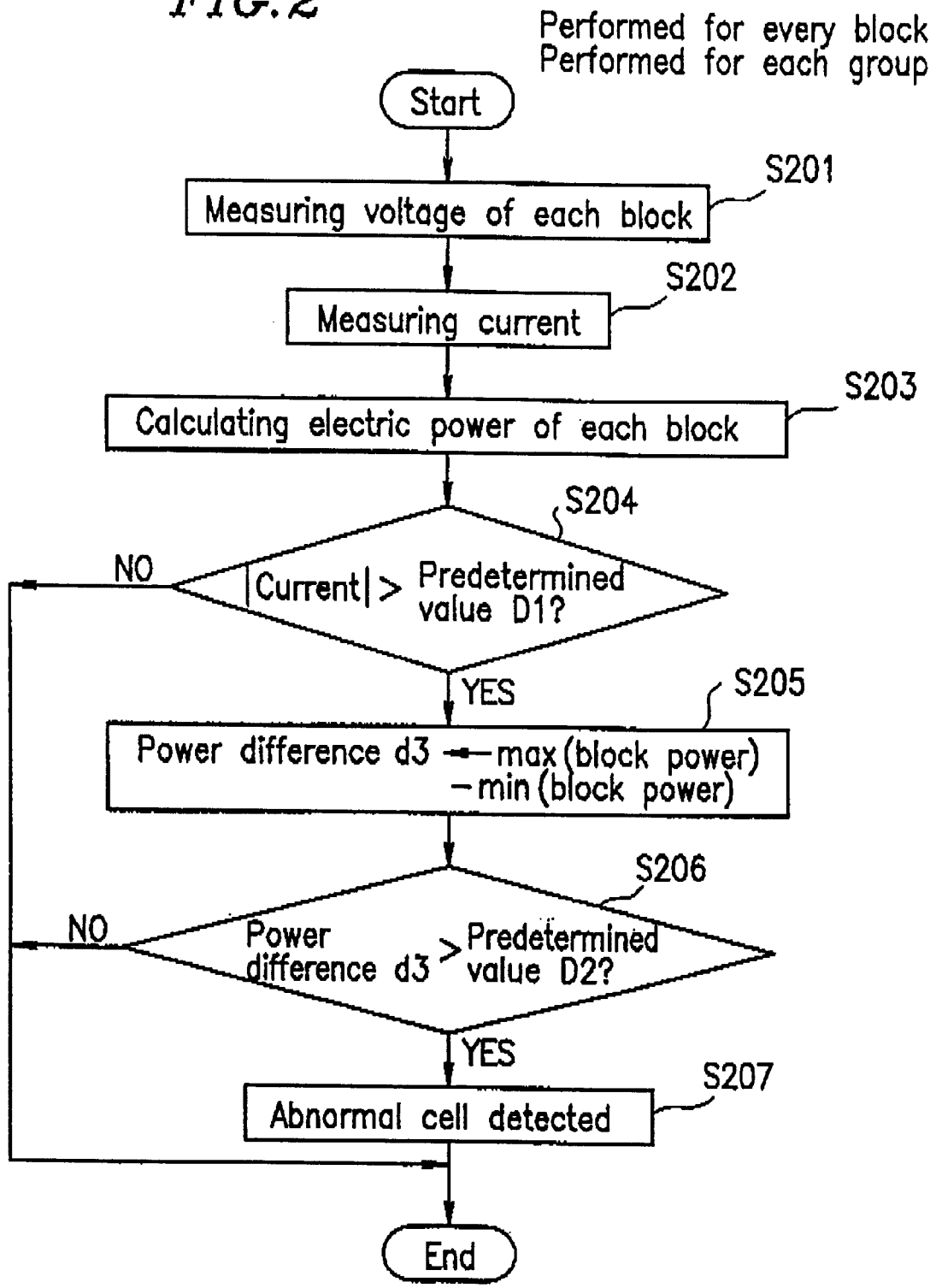
FIG. 2 is a flow chart of a first abnormal cell detecting method according to one embodiment of the present invention.
Figure 3:
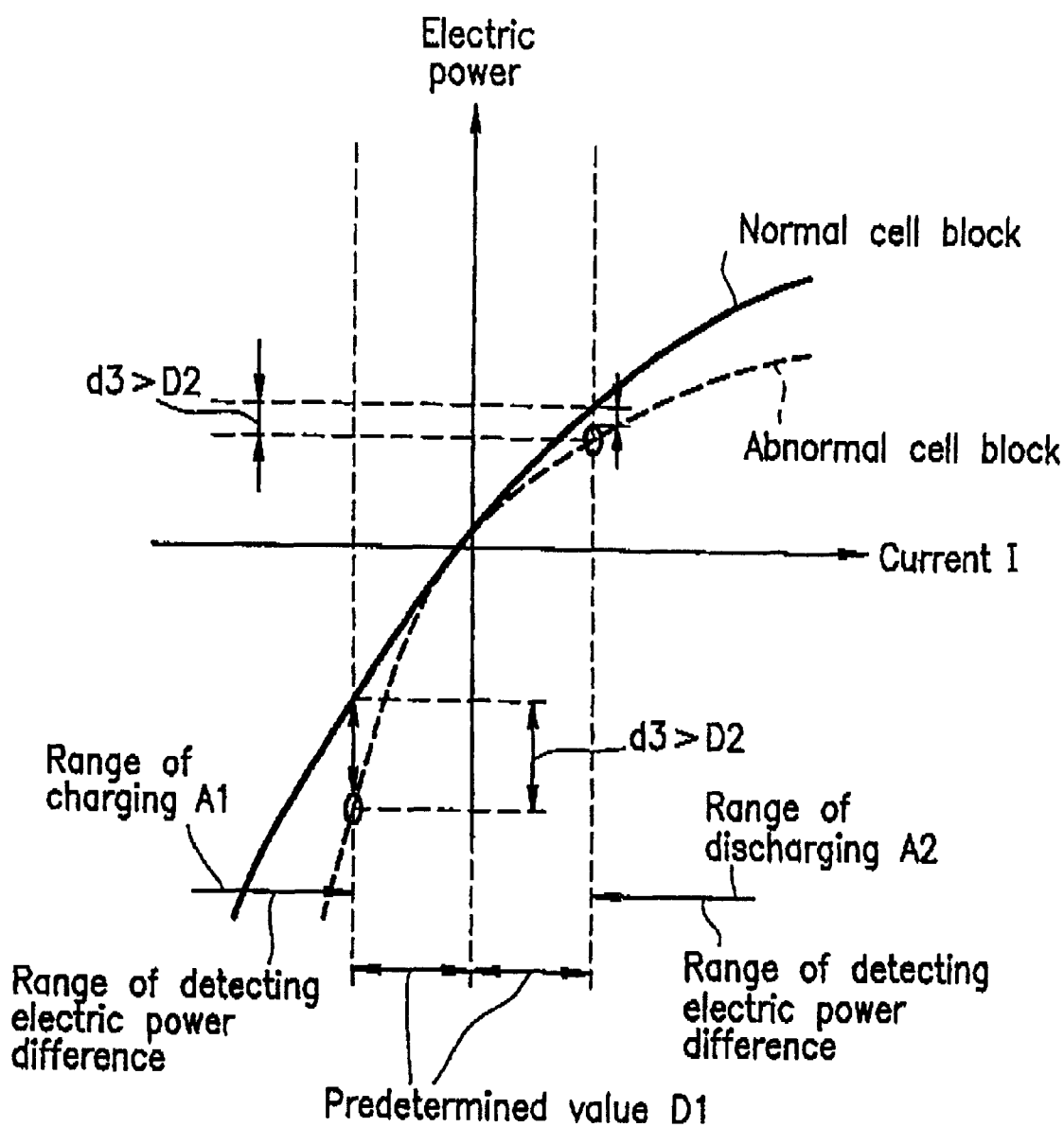
FIG. 3 is a graph illustrating the relationship between the current and the electric power for a normal block and an abnormal block according to one embodiment of the present invention.

Referring to FIGS. 2 and 3, a first abnormal cell detecting method according to Embodiment 1 will be described. FIG. 2 illustrates a flow chart of the first abnormal cell detecting method. FIG. 3 illustrates the relationship between the current and the electric power of a normal block and an abnormal block according to Embodiment 1 of the present invention.

In the first abnormal cell detecting method, the electric power of each of the blocks 100 in the charging process or in the discharging process is measured continuously based on the relationship between the corresponding one of the respective block voltages V1 to Vn of the blocks 10A and the cell current of the battery system 10 so that a difference in electric power between two blocks (the block of interest and a reference block) of the blocks 10A in the charging process or in the discharging process (hereinafter, the "charge/discharge power difference") can be obtained from the measurement results. In the case that the cell current of the battery system 10 (with reference to the reference block) is equal to or greater than a predetermined value D1, and the charge/discharge power difference of one of the blocks 10A is equal to or greater than a predetermined value D2, the block 10A is determined to include an abnormal cell.

Each block voltage detecting section 2 detects the corresponding one of the respective block voltages V1 to Vn of the blocks 10A (S201). The current detecting section 3 detects the cell current of the battery system 10 (S202). The CPU 4 calculates the charge electric power and the discharge electric power for each block 10A based on the relationship between one of the block voltages V1 to Vn of the blocks 10A detected by the corresponding block voltage detecting section 2 and the cell current of the battery system 10 detected by the current detecting section 3 (S203).

The CPU 4 determines whether or not the absolute value of the cell current of the battery system 10 exceeds the predetermined value D1 (S204). If the absolute value of the cell current is determined to exceed the predetermined value D1, the CPU 4 subtracts the minimum value of the charge electric power or discharge electric power among the blocks 10A from the maximum value of the charge electric power or discharge electric power among the blocks 10A, thereby calculating a charge/discharge power difference d3 (S205).

The CPU 4 determines whether or not the charge/discharge power difference d3 exceeds the predetermined value D2 (S206). If the charge/discharge power difference d3 is determined to exceed the predetermined value D2, the CPU 4 determines that an abnormal cell is included in the block 10A having the charge/discharge power difference d3 which exceeds the predetermined value D2 (S207).

The first abnormal cell detecting process is ended when the absolute value of the cell current of the battery system 10 is determined not to exceed the predetermined value D1, when the charge/discharge power difference d3 is determined not to exceed the predetermined value D2 or when the block 10A, having the charge/discharge power difference d3 which exceeds the predetermined value D2, is determined to include an abnormal cell.

As can be seen in FIG. 3 in the case that the battery system 10 includes the block 10A having an abnormal cell, the charge/discharge power difference d3 exceeds the predetermined value D2 in ranges where the absolute value of the cell current exceeds the predetermined value D1 (in a charging range A1 and a discharging range A2). Each of the predetermined values D2 in the charging process and the discharging process is determined arbitrarily according to each of the embodiments of the present invention.

FIG. 7 is a graph illustrating measurement results of the current and the block voltage for a normal block and an abnormal block. FIG. 8 is a graph illustrating measurement results of the current and the block electric power for a normal block and an abnormal block.

FIG. 7 illustrates the relationship between the block voltage and the cell current in a range of ±150 amperes of the current used for a hybrid electric vehicle. The slope of a straight line L1 representing the relationship between the block voltage and the cell current for a normal block is different from that of a straight line L2 representing the relationship between the block voltage and the cell current for the block including abnormal cell. Each slope of the lines corresponds to an internal resistance in each of the blocks. Thus, the internal resistance of the normal block is different from that of the block including an abnormal cell. The straight line L2 represents the relationship between the block voltage and the cell current for a block in which only one cell has 5 times the internal resistance of a normal cell.

Referring to FIG. 8, a curve C1 represents the relationship between the cell current and the block electric power for a normal block. A curve C2 represents the relationship between the cell current and the block electric power for a block in which only one cell has 5 times the internal resistance of a normal cell. The curve C1 corresponds to the straight line L1 as shown In FIG. 7. The curve C2 corresponds to the straight line L2 as shown in FIG. 7.

As can be seen in FIG. 8, in the case that absolute values for the block electric power and the cell current are high, a difference in electric power occurs between the curve C1 representing a normal block and the curve C2 representing a block including an abnormal cell. The curves C1 and C2 as shown in FIG. 8 show that the block electric power for a block including an abnormal cell falls especially in the discharging process.

As described above, according to Embodiment 1, it is determined that an abnormal cell is included in the block 10A which is determined to have: the absolute value of the cell exceeding the predetermined value D1; and the charge/discharge power difference d3 exceeding the predetermined value D2, thereby calculating the internal resistance for each block accurately so that the block including an abnormal cell can be detected accurately.

Moreover, according to Embodiment 1, even if unevenness in capacitance for each cell occurs, the block including an abnormal cell can be detected accurately.

Moreover, according to Embodiment 1, it is possible to detect an abnormal cell by distinguishing a cell in which a drop in electromotive force, a minor short, a short, etc., has occurred from a cell in which the internal resistance has increased.

Moreover, according to Embodiment 1, the electric power values (i.e. physical values) are used, thereby detecting a block including an abnormal cell based on simple logic.

(Embodiment 2)

Referring to FIG. 4, a second abnormal cell detecting method according to Embodiment 2 will be described. In the second abnormal cell detecting method, an accumulated value for the charge electric power or the discharge electric power for each of the plurality of blocks (hereinafter, the "charge/discharge power accumulated value") is obtained based on a time integral value for each of predetermined periods of time of the charge/discharge power difference. If the charge/discharge power accumulated value of one of the blocks 10A is equal to or greater than a predetermined value, the block 10A is determined to include an abnormal cell.

The CPU 4 clears an accumulated value for the charge electric power (hereinafter, the "charge power accumulated value") and an accumulated value for the discharge electric power (hereinafter, the "discharge power accumulated value"), and each block voltage detecting section 2 detects the corresponding one of the respective block voltages V1 to Vn of the blocks 10A (S401). The current detecting section 3 detects the cell current of the battery system 10 (S402). The CPU 4 calculates the charge electric power and the discharge electric power for each of the blocks 10A based on the relationship between one of the block voltages V1 to Vn of the blocks 10A detected by the corresponding block voltage detecting section 2 and the cell current of the battery system 10 detected by the current detecting section 3 (S403).

The CPU 4 determines whether the battery system 10 is in the charging process or the discharging process (S404). If the battery system 10 is determined to be in the charging process, the CPU 4 adds a value obtained by multiplying the charge electric power and a predetermined period of time to the charge power accumulated value for each block (S405). The CPU 4 subtracts the minimum value of the charge power accumulated value among the blocks 10A from the maximum value of the charge power accumulated value among the blocks 10A so as to calculate a difference between the maximum accumulated value of the charge electric power and the minimum accumulated value of the charge electric power (hereinafter, the "charge power accumulated difference" d4) (S406).

The CPU 4 determines whether or not the charge power accumulated difference d4 exceeds the predetermined value D3 (S407). If the charge power accumulated difference d4 is determined to exceed the predetermined value D3, the CPU 4 determines that an abnormal cell is included in the block 10A having the charge power accumulated difference d4 which exceeds the predetermined value D3 (S411).

In Step 404, if the battery system 10 is determined to be In the discharging process, the CPU 4 adds a value obtained by multiplying the discharge electric power and a predetermined period of time to the discharge power accumulated value for each block (S408). The CPU 4 subtracts the minimum value of the discharge power accumulated value among the blocks 10A from the maximum value of the discharge power accumulated value among the blocks 10A so as to calculate a difference between the maximum accumulated value of the discharge electric power and the minimum accumulated value of a discharge electric power (hereinafter, the "discharge power accumulated difference" d5) (S409).

The CPU 4 determines whether or not the discharge power accumulated difference d5 exceeds the predetermined value D4 (S410). If the discharge power accumulated difference d5 is determined to exceed the predetermined value D4, the CPU 4 determines that an abnormal cell is included in the block 10A having the discharge power accumulated difference d5 which exceeds the predetermined value D4 (S411).

The CPU 4 determines whether or not the predetermined period of time has passed (S412) in the following cases: the charge power accumulated difference d4 is not determined to exceed the determined value D3 ("NO" in S407); the discharge power accumulated difference d5 is not determined to exceed the predetermined value D4 ("NO" in S410); or a block 10A is determined to include an abnormal cell (S411). If it is determined that the predetermined period of time has passed, the CPU 4 clears the charge power accumulated value and the discharge power accumulated value (S413). If it is determined that the predetermined period of time has not passed, or if the charge power accumulated value and the discharge power accumulated value are cleared, the second abnormal cell detecting process is ended.

As described above, according to Embodiment 2, the power accumulated values for each predetermined period of time in both the charging process and the discharging process are calculated separately. Accordingly, the power accumulated values of a block including an abnormal cell in both the charging process and the discharging process are low (a current value in the discharging process is +, and a current value in the charging process is −). Thus, it is possible to detect a block including an abnormal cell readily.

Moreover, according to Embodiment 2, the power accumulated values (i.e. physical values) are used, thereby detecting a block including an abnormal cell based on simple logic.

(Embodiment 3)

Referring to FIG. 5 a third abnormal cell detecting method according to Embodiment 3 will be described. In the third abnormal cell detecting method, in the case that one of the blocks 10A satisfies the following conditions (1) and (2) at the same time: (1) the charge power difference thereof is greater than the average value of the charge power difference for all blocks by an amount equal to or greater than a predetermined value (hereinafter, the "condition (1)"); and (2) the discharge power difference thereof is smaller than the average value of the discharge power difference for all blocks by an amount equal to or greater than a predetermined value (hereinafter, the "condition (2)"), it in determined that an abnormal cell exists in the block 10A.

S501 to S506 are identical with S201 to S206 as described above with reference to FIG. 2. Each block voltage detecting section 2 detects the corresponding one of the respective block voltages V1 to Vn of the blocks 10A (S501). The current detecting section 3 detects the cell current of the battery system 10 (S502). The CPU 4 calculates the charge electric power and the discharge electric power of each block 10A based on the block voltage of each block 10A detected by each block voltage detecting section 2 and the cell current of the battery system 10 detected by the current detecting section 3 (S503).

The CPU 4 determines whether or not the absolute value of the cell current of the battery system 10 exceeds the predetermined value D1 (S604). If the absolute value of the cell current is determined to exceed the predetermined value D1, the CPU 4 subtracts the minimum value of the charge electric power and the discharge electric power among the blocks 10A from the maximum value of the charge electric power and discharge electric power among the blocks 10A, thereby calculating the charge/discharge power difference d3 (S505).

The CPU 4 determines whether or not the charge/discharge power difference d3 exceeds the predetermined value D2 (S506). If the charge/discharge power difference d3 is determined to exceed the predetermined value D2, the CPU 4 determines whether or not one of the blocks satisfies the conditions (1) and (2) as described above at the same time (S507).

If one of the blocks is determined to satisfy the conditions (1) and (2) as described above at the same time, the CPU 4 determines that an abnormal cell has occurred in the block 10A which satisfies the conditions (S508).

The third abnormal cell detecting process is ended in the following cases: the absolute value of the cell current is determined not to exceed the determined value D1 ("NO" in S504); the charge/discharge power difference d3 is determined not to exceed the predetermined value D2 ("NO" in S506); or any of the blocks is determined not to satisfy the conditions (1) and (2) as described above at the same time ("NO" in S507).

As described above, according to Embodiment 3, an abnormal cell is determined to be included in the block 10A, wherein: the absolute value of the cell current exceeds the predetermined value D1; the charge/discharge power difference d3 exceeds the predetermined value D2; and the conditions (1) and (2) are satisfied at the same time. Thus, it is possible to calculate the internal resistance for each block accurately and detect a block including an abnormal cell.

Although a difference in temperature may occur in the battery system under the influence of temperature of each cell, by grouping the blocks 10A into a plurality of groups so that a difference in temperature between blocks in each group becomes small, the methods for detecting an abnormal cell as described above with reference to FIGS. 2, 4 and 5 are performed for each group. The grouping is determined based on arrangements of the cells and a cooling system of the battery system.

(Embodiment 4)

Referring to FIG. 6, a fourth abnormal cell detecting method according to Embodiment 4 will be described. In the fourth abnormal cell detecting method, in the case that one of the blocks 10A satisfies the following conditions (3) and (4) at the same time: (3) the charge power accumulated difference thereof is greater than the average value of the charge power accumulated difference for all blocks by an amount equal to or greater than a predetermined value (hereinafter, the "condition (3)"); and (4) the discharge power accumulated difference thereof is smaller than the average value of the discharge power difference for all blocks by an amount of a predetermined value (hereinafter, the "condition (4)"), it is determined that an abnormal cell has occurred in the block 10A.

S601 to S610 are identical with S401 to S410 as described above with reference to FIG. 4. The CPU 4 clears the charge power accumulated value and the discharge power accumulated value, and each block voltage detecting section 2 detects the corresponding one of the respective block voltages V1 to Vn of the blocks 10A (S601). The current detecting section 3 detects the cell current of the battery system 10 (S602). The CPU 4 calculates the charge electric power and the discharge electric power of each block 10A based on one of the block voltages V1 to Vn of the blocks 10A detected by each block voltage detecting section 2 and the cell current of the battery system 10 detected by the current detecting section 3 (S603).

The CPU 4 determines whether the battery system 10 is in the charging process or the discharging process (S604). If the battery system 10 is determined to be in the charging process, the CPU 4 adds a value obtained by multiplying the charge electric power and a predetermined period of time to the charge power accumulated value for each block (S605). The CPU 4 subtracts the minimum value of the charge power accumulated value among the blocks 10A from the maximum value of the charge power accumulated value among the blocks 10A so as to calculate the charge power accumulated difference d4 (S606). The CPU 4 determines whether or not the charge power accumulated difference d4 exceeds the predetermined value D3 (S607).

In Step 604, if the battery system 10 is determined to be in the discharging process, the CPU 4 adds a value obtained by multiplying the discharge electric power and a predetermined period of time to the discharge power accumulated value for each block (S608). The CPU 4 subtracts the minimum value of the discharge power accumulated value among the blocks 10A from the maximum value of the discharge power accumulated value among the blocks 10A so as to calculate the discharge power accumulated difference d5 (S609). The CPU 4 determines whether or not the discharge power accumulated difference d5 exceeds the predetermined value D4 (S610).

If one of the blocks is determined to satisfy the conditions (3) and (4) as described above at the same time, the CPU 4 determines that an abnormal cell has occurred in the block 10A which satisfies the conditions.

If the charge power accumulated difference d4 is determined to exceed the predetermined value D3 ("YES" in S607), or if the discharge power accumulated difference d5 is determined to exceed the predetermined value D4 ("YES" in S610), it is determined whether or not one of the blocks satisfies the conditions (3) and (4) as described above at the same time (S611).

If one of the blocks is determined to satisfy the conditions (3) and (4) as described above at the same time, the CPU 4 determines that an abnormal cell is included in the block 10A which satisfies the conditions (S612).

The CPU 4 determines whether or not the predetermined time has passed (S613) in either of the following cases: the charge power accumulated difference d4 is determined not to exceed the predetermined value D3 ("NO" in S607); the discharge power accumulated difference d5 is determined not to exceed the predetermined value D4 ("NO" in S610); any of the blocks is determined not to satisfy the conditions (3) and (4) as described above at the same time ("NO" in S611); or the CPU 4 determines that an abnormal cell is included in the block 10A which satisfies the conditions.

If the CPU 4 determines that the predetermined time has passed, the CPU 4 clears the charge power accumulated value and the discharge power accumulated value (S614). If the CPU 4 determines that the predetermined time has not passed, or if the CPU 4 clears the charge power accumulated value and the discharge power accumulated value, the fourth abnormal cell detecting process will be ended.

As described above, according to Embodiment 4, the power accumulated values for each predetermined period of time in both the charging process and the discharging process are calculated separately. Accordingly, the power accumulated value of a block including an abnormal cell is low in both the charging process and the discharging process (a current value in the discharging process is +, and a current value in the charging process is −). Thus, it is possible to detect a block including an abnormal cell readily.

Moreover, according to Embodiment 4, an abnormal cell is determined to be included in the block 10A which satisfies the conditions (3) and (4) as described above at the same time, thereby calculating the internal resistance for each block accurately so as to detect a block including an abnormal cell.

EFFECTS OF THE INVENTION

As described above, the present invention provides a method for detecting an abnormal cell which it capable of detecting a block including an abnormal cell accurately by calculating an increase in internal resistance for each block.

The present invention further provides a method for detecting an abnormal cell which is capable of detecting a block including an abnormal cell accurately even if unevenness in capacitance among cells occurs.

The present invention further provides a method for detecting an abnormal cell which is capable of distinguishing a cell in which a drop in electromotive force, a minor short, a short, etc., has occurred from a cell in which an internal resistance has increased.

Various other modifications will be apparent to and can be readily made by those skilled in the art without departing from the scope and spirit of this invention. Accordingly it is not intended that the scope of the claims appended hereto be limited to the description as set forth herein, but rather that the claims be broadly construed.

What is claimed is:

1. A method for detecting an abnormal cell in a battery system, wherein:

the battery system includes a plurality of blocks serially connected together;

each of the plurality of blocks includes a plurality of cells serially connected together; and the method comprises:
- a first step of detecting a block voltage for each of the plurality of blocks and detecting a current of the battery system;
- a second step of calculating a charge/discharge electric power for each of the plurality of blocks based on the block voltage and the current;
- a third step of determining whether or not a value of the current is equal to or greater than a first predetermined value;
- a fourth step of determining whether or not a difference of the charge/discharge electric power between at least any two of the plurality of blocks is equal to or greater than a second predetermined value; and
- a fifth step of detecting a block including an abnormal cell based on determination results from the third step and the fourth step.

2. A method for detecting an abnormal cell according to claim 1, wherein:
- the plurality of blocks is grouped into at least a first group and a second group; and
- the fourth step comprises a step of determining:
  - whether or not a difference of the charge/discharge electric power between at least any two of several blocks of the first group is equal to or greater than a second predetermined value; and
  - whether or not a difference of the charge/discharge electric power between at least any two of the several blocks of the second group is equal to or greater than the second predetermined value.

3. A method for detecting an abnormal cell according to claim 2, wherein:
- a temperature difference of any one of the blocks of the first group is smaller than the temperature difference between any one of the blocks of the first group and any one of the blocks of the second group; and
- a temperature difference of any one of the blocks of the second group is smaller than the temperature difference between any one of the blocks of the second group and any one of the blocks of the first group.

4. A method for detecting an abnormal cell according to claim 1, wherein the fourth stop comprises a step of determining that an abnormal cell in which an internal resistance has increased exists in the block in the case that the block satisfies the following conditions (1) and (2): (1) a charge power difference is greater than the average value of a charge power difference between at least any two of the plurality of blocks by an amount equal to or greater than a third predetermined value; and (2) a discharge power difference is smaller than the average value of a discharge power difference between at least any two of the plurality of blocks by an amount equal to or greater than a fourth predetermined value.

5. A method for detecting an abnormal cell according to claim 2, wherein the fourth step comprises a step of determining that an abnormal cell in which an internal resistance has increased exists in the block in the case that the block satisfies the following conditions (1) and (2): (1) a charge power difference is greater than the average value of the charge power difference between at least any two of several blocks of the first group by an amount equal to or greater than the third predetermined value; and (2) a discharge power difference is smaller than the average value of the discharge power difference between at least any two of several blocks of the first group by an amount equal to or greater than the fourth predetermined value.

6. A method for detecting an abnormal cell in a battery system, wherein:
- the battery system includes a plurality of blocks serially connected together;
- each of the plurality of blocks includes a plurality of cells serially connected together; and
- the method comprises:
  - a first step of detecting a block voltage for each of the plurality of blocks and a current of the battery system;
  - a second step of calculating a charge/discharge power for each of the plurality of blocks based on the block voltage and the current;
  - a third step of obtaining a charge/discharge power accumulated value for each of the plurality of blocks based on a time accumulated value for each of predetermined periods of time of the charge/discharge power;
  - a fourth step of determining whether or not a difference of the charge/discharge power accumulated value between at least any two of the plurality of blocks is equal to or greater than a first predetermined value; and
  - a fifth step of detecting a block including an abnormal cell based on a determination result of the fourth step.

7. A method for detecting an abnormal cell according to claim 6, wherein:
- the plurality of blocks is grouped into at least a first group and a second group; and
- the fourth step comprises steps of determining:
  - whether or not a difference of the charge/discharge power accumulated value between at least any two of several blocks of the first group is equal to or greater than a first predetermined value; and
  - whether or not a difference of the charge/discharge power accumulated value between at least any two of several blocks of the second group is equal to or greater than a first predetermined value.

8. A method for detecting an abnormal cell according to claim 7, wherein:
- a temperature difference of any one of the blocks of the first group is smaller than the temperature difference between any one of the blocks of the first group and any one of the blocks of the second group; and
- a temperature difference of any one of the blocks of the second group is smaller than the temperature difference between any one of the blocks of the second group and any one of the blocks of the first group.

9. A method for detecting an abnormal cell according to claim 6, wherein the fourth step comprises a step of determining that an abnormal cell in which an internal resistance has increased exists in the block in the case that the block satisfies the following conditions (1) and (2):(1) a difference of a charge power accumulated value is greater than the average value of a difference of a charge power accumulated value between at least any two of the plurality of blocks by an amount equal to or greater than a second predetermined value; and (2) a difference of discharge power accumulated value is smaller than the average value of a difference of a discharge power accumulated value between at least any two of the plurality of blocks by an amount equal to or greater than a third predetermined value.

10. A method for detecting an abnormal cell according to claim 7, wherein:
- the fourth step comprises a step of determining an abnormal cell in which an internal resistance has increased exists in the block in the case that the block satisfies the following conditions (1) and (2): (1) a difference of a charge power accumulated value is greater than an average value of a difference of a charge power accumulated value between at least any two of several blocks of the first group by an amount equal to or greater than a second predetermined value; and (2) a difference of discharge power accumulated value is smaller than an average value of a difference of a discharge power accumulated value between at least any two of several blocks of the first group by an amount equal to or greater than a third predetermined value.

* * * * *